United States Patent [19]

Jacklin

[11] Patent Number: 5,982,823
[45] Date of Patent: Nov. 9, 1999

[54] DIRECT FREQUENCY SELECTION AND DOWN-CONVERSION FOR DIGITAL RECEIVERS

[76] Inventor: William Edward Jacklin, 150 W. Saint Charles Rd., Apt. 116, Lombard, Ill. 60148

[21] Appl. No.: 09/044,202

[22] Filed: Mar. 17, 1998

[51] Int. Cl.[6] .................................................. H04L 27/06
[52] U.S. Cl. .................. 375/344; 455/182.3; 375/316
[58] Field of Search .................. 375/316, 344, 375/261, 267; 455/182.1, 182.3, 192.1, 192.3, 130; 364/724.1, 723

[56] References Cited

U.S. PATENT DOCUMENTS

| | | | |
|---|---|---|---|
| 4,785,463 | 11/1988 | Janc et al. | 375/1 |
| 4,893,316 | 1/1990 | Janc et al. | 375/44 |
| 5,131,008 | 7/1992 | Kazecki et al. | 375/97 |
| 5,163,159 | 11/1992 | Rich et al. | 455/74 |
| 5,222,144 | 6/1993 | Whihehart | 375/39 |
| 5,375,146 | 12/1994 | Chalmers | 375/103 |
| 5,386,438 | 1/1995 | England | 375/121 |
| 5,438,595 | 8/1995 | Cheng et al. | 375/340 |
| 5,460,424 | 10/1995 | Banavong et al. | 375/345 |
| 5,544,200 | 8/1996 | An | 375/344 |
| 5,557,643 | 9/1996 | Kim et al. | 375/324 |
| 5,581,579 | 12/1996 | Lin et al. | 375/331 |
| 5,825,241 | 12/1995 | Beale et al. | 375/261 |
| 5,841,396 | 12/1996 | Krasner | 342/357 |

*Primary Examiner*—Chi H. Pham
*Assistant Examiner*—Emmanuel Bayard
*Attorney, Agent, or Firm*—Terry J. Anderson; Karl J. Hoch, Jr.

[57] ABSTRACT

A method and a coarse tuning circuit for performing direct frequency selection and down-conversion on a received analog bandpass signal for a digital receiver having C channels are disclosed. Each of the C channels has a bandwidth B. The analog bandpass signal in a channel of interest has a center frequency $f_c$ and a two-sided bandwidth not greater than B. The method comprises the following steps: (a) sampling the bandpass signal at a sampling frequency $f_s$ greater than twice the product of B and C, to produce a digital sampled signal which has an intermediate frequency much closer to the baseband frequency of zero kilohertz than the sampling frequency $f_s$; (b) computing, from $f_c$ and $f_s$, a non-negative integer value m to determine the selection of a channel from the C channels of the digital receiver; and (c) forming directly from the digital sampled signal two digital signals $I_1$ and $Q_1$ such that they correspond to a digital in-phase component and a quadrature component, respectively, of a complex signal which is approximately centered at a frequency $\Delta f$ proximate of the baseband frequency, and which has a frequency spectrum approximately equal to that of the analog bandpass signal.

27 Claims, 1 Drawing Sheet

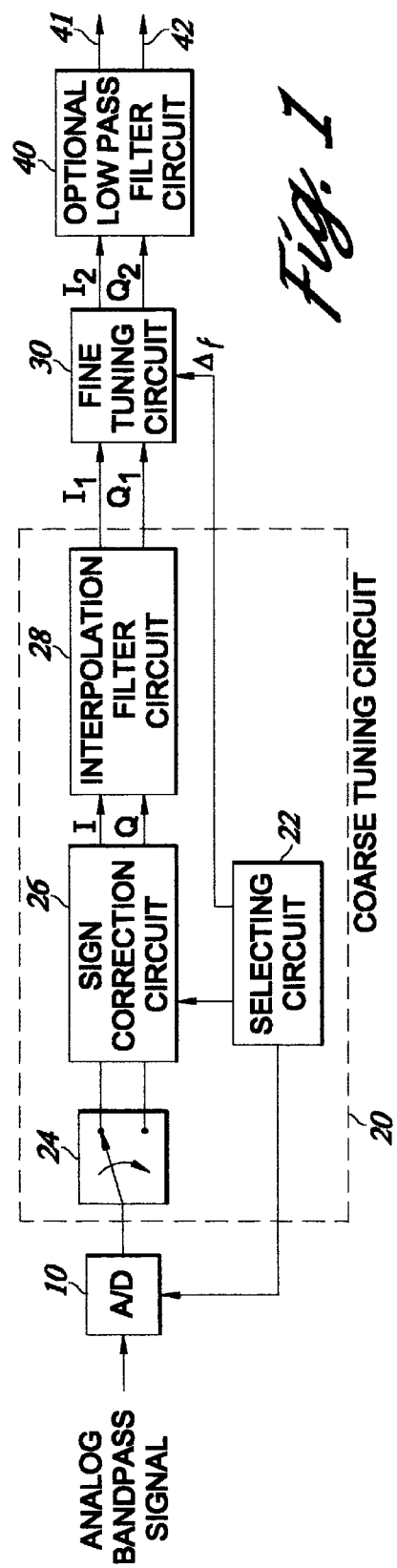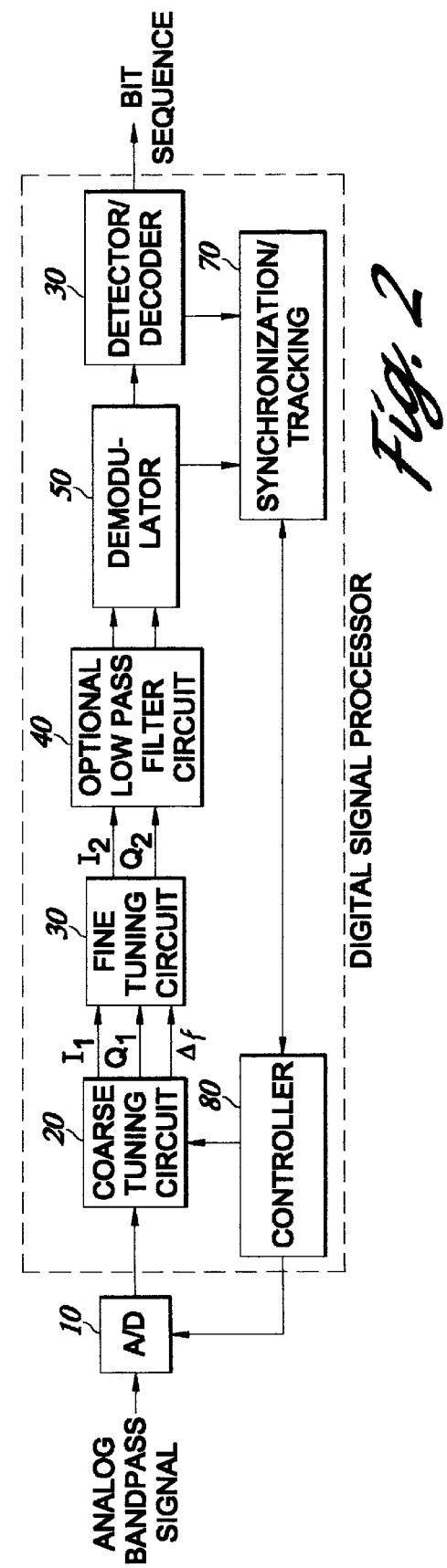

DIRECT FREQUENCY SELECTION AND DOWN-CONVERSION FOR DIGITAL RECEIVERS

FIELD OF THE INVENTION

The present invention relates generally to methods and systems for processing analog bandpass signals in a digital receiver, and more particularly to a method and a system for performing frequency selection and down-conversion of analog bandpass signals in a digital receiver without using external analog local oscillators.

BACKGROUND OF THE INVENTION

A typical digital wireless communications system consists of a transmitter, a receiver and communication channels wirelessly connecting the receiver to the transmitter. At the transmitter, an information bit sequence is coded and transformed into an analog waveform centered at baseband frequency, which is subsequently up-converted to be centered at a higher frequency in order to be sent over one of a number of predetermined radio frequency (RF) channels. At a given receiver, the RF received signal in the desired channel is down-converted to one or more successive intermediate frequencies (IF) before being converted to baseband frequency. The resulting analog baseband signal is then passed through an analog-to-digital (A/D) converter. The resulting digital baseband signal is used as input to a demodulator, a detector, a decoder, and a synchronization and tracking algorithm to recover the original information bit sequence.

In standard digital receivers, external analog local oscillators (LOs) and bandpass filters are used to implement each IF down-conversion stage, including the final conversion to baseband frequency. Furthermore, in one of these IF stages, an additional tunable LO is used to select the desired signal channel.

It has been found that, if the carrier frequency of the analog IF signal entering the baseband conversion stage, denoted as $f_c$, is related to the sampling frequency $f_s$ of the digital signal processing (DSP) receiver by the following expression, called quadrature sampling condition, $$f_s = \frac{4f_c}{2m+1},$$

for m an integer then the analog IF signal can be directly converted to baseband. Thus, the quadrature sampling method allows elimination of an external LO which would have been needed to further down-convert the IF frequency to baseband.

However, since the sampling frequency $f_s$ is typically fixed for a given receiver, the frequency $f_c$ of an incoming analog IF signal must be chosen to satisfy the quadrature sampling condition. This requires the use of a tunable external LO to tune to the desired signal channel and to translate the carrier frequency of a received analog signal to an IF carrier frequency that satisfies the quadrature sampling condition. Therefore, in practice, the quadrature sampling method does not eliminate the use of at least one tunable external LO.

The present invention discloses a method and a system for performing frequency selection and down-conversion for digital radios, modems and receivers without the need for an external tunable LO. Moreover, in the present invention, the frequency selection and down-conversion are performed digitally, for example, by a digital signal processor. If an A/D converter with sufficient bandwidth is used to provide the input to the digital receiver, then a front-end fixed down-conversion to an arbitrary frequency $f_c$ is not needed. Thus, with the present invention, all of the external analog LOs that are typically used prior to the A/D conversion of the received analog signal are eliminated.

SUMMARY OF THE INVENTION

A method and a coarse tuning circuit for performing direct frequency selection and down-conversion on a received analog bandpass signal for a digital receiver having C channels are disclosed. Each of the C channels has a bandwidth B. The analog bandpass signal in a channel of interest has a center frequency $f_c$ and a two-sided bandwidth not greater than B. The method comprises the following steps: (a) sampling the bandpass signal at a sampling frequency $f_s$ greater than twice the product of B and C, to produce a digital sampled signal which has an intermediate frequency much closer to the baseband frequency of zero kilohertz than the sampling frequency $f_s$; (b) computing, from $f_c$ and $f_s$, a non-negative integer value m to determine the selection of a channel from the C channels in the digital receiver; and (c) forming directly from the digital sampled signal two digital signals $I_1$ and $Q_1$ such that they correspond to a digital in-phase component and a quadrature component, respectively, of a complex signal which is approximately centered at a frequency $\Delta f$ proximate of the baseband frequency, and which has a frequency spectrum approximately equal to that of the analog bandpass signal.

Step (c) of the method comprises the steps of: (i) forming from the digital sampled signal $\{r(kT_s),$ with $T_s=1/f_s$ and $k=0, 1, \ldots \}$ a sequence of even samples $\{r(kT_s),$ with $T_s=1/f_s$ and $k=0, 2, 4, \ldots \}$ and a sequence of odd samples $\{r(kT_s),$ with $T_s=1/f_s$ and $k=1, 3, 5, \ldots \}$; (ii) generating from the sequences of even samples and odd samples a sequence I and a sequence Q such that the sequences I and Q are approximately equal to an in-phase component and a quadrature component, respectively, of a complex signal centered near the baseband frequency having a frequency spectrum approximately equal to that of the analog bandpass signal; and (iii) forming the digital signals $I_1$ and $Q_1$ by interpolating at least one digital value between every two consecutive samples of the sequences I and Q, respectively, resulting in each of the digital signals $I_1$ and $Q_1$ being lowpass filtered and having a sampling rate greater than that of each of the sequences I and Q.

More particularly, the sequences I and Q are generated according to the following formula:

$I=\{r(0), -r(2T_s), r(4T_s), -r(6T_s), \ldots \},$ if m is even, $Q=\{-r(T_s), r(3T_s), -r(5T_s), r(7T_s), \ldots \},$ if m is odd, $Q=\{r(T_s), -r(3T_s), r(5T_s), -r(7T_s), \ldots \},$ where m is the integer rounded-off value of the expression $(4f_c-f_s)/2f_s$.

If the sampling frequency $f_s$ satisfies the quadrature sampling expression, i.e., if it is equal to $4f_c/(2m+1)$, where m is an integer, then the complex signal corresponding to the sequences I and Q is centered at the baseband frequency. Consequently, the digital signals $I_1$ and $Q_1$ correspond to a complex baseband signal centered at the baseband frequency, and there is no need to further tuning these signals before applying them to a demodulator.

If the sampling frequency $f_s$ is not related to the frequency $f_c$ by the quadrature sampling expression, i.e., if it is not equal to $4f_c/(2m+1)$, where m is an integer, then the intermediate frequency of the digital sampled signal differs from the baseband frequency by an amount equal to $(f_s/4)+\Delta f$. The frequency $\Delta f$ is equal to $(2m+1)(f_s/4)-f_c$, where m is the integer rounded-off value of the expression $(4f_c-f_s)/2f_s$.

In the case where the sampling frequency $f_s$ is not related to the frequency $f_c$ by the quadrature sampling expression, the method of the present invention further comprises the step of shifting in complex frequency the digital signals $I_1$ and $Q_1$ by an amount equal to $\Delta f$ to form the digital signals $I_2$ and $Q_2$. The resulting digital signals $I_2$ and $Q_2$ correspond to an in-phase component and a quadrature component, respectively, of a complex baseband signal having a frequency spectrum centered at the baseband frequency and approximately equal to the analog bandpass signal frequency spectrum centered at the frequency $f_c$.

More specifically, the digital signals $I_2$ and $Q_2$ are formed from the digital signals $I_1$ and $Q_1$ according to the following formula:

$$I_2(kT_s)=I_1(kT_s)\cos(2\pi\Delta f kT_s)-Q_1(kT_s)\sin(2\pi\Delta f kT_s),$$

$$Q_2(kT_s)=Q_1(kT_s)\cos(2\pi\Delta f kT_s)+I_1(kT_s)\sin(2\pi\Delta f kT_s),$$

for k=0, 1, 2, . . . , where $T_s=1/f_s$.

A coarse tuning circuit for implementing the method of the present invention is disclosed. The coarse tuning circuit directly selects a frequency channel from the C channels in the digital receiver and down-converts to a frequency near the baseband frequency the digital sampled signal formed by sampling a received analog bandpass signal which is centered at a frequency $f_c$ and has a two-sided bandwidth B at a sampling rate $f_s$ greater than twice the product of B and C.

The coarse tuning circuit comprises a selecting circuit, a switching circuit, a sign correction circuit and an interpolation filter circuit. The selecting circuit computes, from $f_c$ and $f_s$, a non-negative integer value m, to determine the channel of interest from the C channels in the digital receiver. The non-negative integer value m is computed as the integer rounded-off value of the expression $(4f_c-f_s)/2f_s$.

The switching circuit receives the digital sampled signal $\{r(kT_s), \text{with } T_s=1/f_s \text{ and } k=0, 1, \ldots \}$, and forms a sequence of even samples and a sequence of odd samples from the received digital sampled signal.

The sign correction circuit receives the non-negative integer value m and the sequences of even samples and odd samples, and generates a sequence I and a sequence Q such that the sequences I and Q are approximately equal to an in-phase component and a quadrature component, respectively, of a complex signal centered near the baseband frequency having a frequency spectrum approximately equal to the analog bandpass signal frequency spectrum.

The interpolation filter circuit then lowpass filters the sequences I and Q to produce the digital signals $I_1$ and $Q_1$. This filter circuit interpolates at least one digital value between every two consecutive samples of the sequences I and Q, respectively, resulting in each of the digital signals $I_1$ and $Q_1$ having a sampling rate greater than that of each of the sequences I and Q.

A system for digitally performing direct frequency selection and down-conversion on an analog bandpass signal for a digital receiver having C channels is also disclosed. The system comprises: (a) an analog-to-digital (A/D) converter, (b) a coarse tuning circuit, and (c) a fine tuning circuit.

The A/D converter samples the analog bandpass signal which has a two-sided bandwidth B and a center frequency $f_c$ at a sampling frequency $f_s$ greater than twice the product of B and C, and outputs the resulting digital sampled signal which has an intermediate frequency closer to the baseband frequency than $f_s$.

The coarse tuning circuit is as disclosed above. This circuit generates two digital signals $I_1$ and $Q_1$ which correspond to a complex signal obtained by shifting this intermediate frequency of the digital sampled signal toward the baseband frequency of zero kilohertz (kHz). The resulting shifted intermediate frequency differs from the baseband frequency by an amount $\Delta f$.

The fine tuning circuit then shifts in complex frequency toward the baseband frequency of 0 kHz the digital signals $I_1$ and $Q_1$ by the amount $\Delta f$ to form the digital signals $I_2$ and $Q_2$.

If the sampling frequency $f_s$ is equal to $4f_c/(2m+1)$, i.e., the sampling rate required by a standard quadrature sampling method, then $\Delta f$ is equal to zero, and there is no need to fine tune the signals $I_1$ and $Q_1$. In practice, it is desirable to have a sampling frequency $f_s$ equal to an integer multiple of the data bit rate, in order to yield an integer number of samples per bit. For example, many current wireless modems operate at 8 kilobits per second, thus a suitable sampling frequency would be an integer multiple of 8 kilohertz. However, a sampling frequency which satisfies the standard quadrature sampling requirement is often not an integer multiple of 8 kHz.

The system of the present invention allows the use of a sampling frequency $f_s$ which is an integer multiple of the data bit rate and is not related to the frequency $f_c$ by the standard quadrature sampling requirement. In this case, the sampling frequency $f_s$ is such that an intermediate frequency of the digital sampled signal differs from the baseband frequency by an amount equal to $(f_s/4)+\Delta f$. By generating the sequences I and Q, the sign correction circuit of the coarse tuning circuit translates an image signal included in the digital sampled signal and centered at this intermediate frequency toward the baseband frequency by an amount equal to $f_s/4$. The digital signals $I_1$ and $Q_1$, resulting from interpolating the sequences I and Q, are then shifted in complex frequency by an amount equal to $\Delta f$, by the fine tuning circuit to form the digital signals $I_2$ and $Q_2$. The digital signals $I_2$ and $Q_2$ are approximately equal to an in-phase component and a quadrature component, respectively, of a digital baseband frequency signal, the frequency spectrum of which, centered at the baseband frequency, is approximately equal to the analog bandpass signal frequency spectrum centered at frequency $f_c$.

If the digital receiver has more than one channel, i.e., if C>1, then it is preferable that the signals $I_2$ and $Q_2$ be passed through optional lowpass filters to further suppress any unwanted signal outside the channel of interest.

With the exception of the A/D converter, the disclosed system comprises only simple digital circuits. Thus, these digital circuits can be easily implemented as an integral part of the digital signal processor that typically would be used to perform the digital demodulation functions.

These, as well as other advantages of the present invention will be more apparent from the following description and drawings. It is understood that changes in the specific structure shown and described may be made within the scope of the claims without departing from the spirit of the invention.

BRIEF DESCRIPTION OF THE DRAWINGS

FIG. 1 shows a block diagram of the system of the present invention.

FIG. 2 shows the disclosed system as an integral part of a digital signal processor.

DETAILED DESCRIPTION OF THE INVENTION

The detailed description set forth below in connection with the appended drawings is intended as a description of the presently preferred embodiment of the invention, and is not intended to represent the only form in which the present invention may be constructed or utilized. The description sets forth the functions and the sequence of the steps for constructing and operating the invention in connection with the illustrated embodiment. It is to be understood, however, that the same or equivalent functions may be accomplished by different embodiments that are also intended to be encompassed within the spirit and scope of the invention.

FIG. 1 shows a block diagram of the system of the present invention. The system comprises an A/D converter 10, a coarse tuning circuit 20, a fine tuning circuit 30 and an optional lowpass filter circuit 40. The coarse tuning circuit 20 comprises a selecting circuit 22, a switching circuit 24, a sign correction circuit 26, and an interpolation filter circuit 28. The system is to be used in a digital receiver having C channels, each having a bandwidth of B kilohertz, including guard band.

An analog bandpass signal $\{r(t)\}$ having a center frequency $f_c$ and a two-sided bandwidth not greater than B is inputted into the A/D converter 10. The A/D converter 10 samples the analog bandpass signal at a sampling frequency $f_s$ which is greater than twice the overall system bandwidth, i.e., the product of B and C, to produce a digital sampled signal $\{r(kT_s), \text{with } T_s=1/f, \text{and } k=0, 1, \ldots\}$. The frequency spectrum of this digital sampled signal consists of images of the analog bandpass signal frequency spectrum. Since the sampling frequency $f_s$ is greater than twice the overall system bandwidth, these images are equally spaced from one another without overlap. Consequently, the analog signal is represented perfectly by the digital samples. The value of the sampling frequency $f_s$ is typically fixed for a given receiver implementation. It is desirable to have a sampling frequency $f_s$ equal to an integer multiple of the data bit rate, in order to yield an integer number of samples per bit. For example, many current wireless modems operate at 8 kilobits per second, thus a suitable sampling frequency would be an integer multiple of 8 kilohertz. Also, after sampling at the sampling frequency $f_s$, one of the images of the analog bandpass signal frequency spectrum is centered at $f_s/4+\Delta f$. For example, for $f_c=455$ kHz, $B=12.5$ kHz, $f_s=32$ kHz, there is an image of the analog signal spectrum centered at 9 kHz (here, $\Delta f=1$ kHz).

The selecting circuit 22 selects a particular channel corresponding to the analog bandpass signal having carrier frequency $f_c$, by computing a non-negative integer m that satisfies the expression $$m = \text{round}\{(4f_c - f_s)/2f_s\}$$

where the function "round" denotes rounding off the value of the inner expression to an integer. For the example where $f_c=455$ kHz and $f_s=32$ kHz, this expression yields the value m=28. In addition to being used for selecting a particular channel corresponding to the analog bandpass signal having carrier frequency $f_c$, the value of m is also used to determine the sign correction factor for the sign correction circuit 26, as described below.

The selecting circuit 22 also computes the frequency offset factor $\Delta f$ according to the following formula:

$$\Delta f = (2m+1)(f_s/4) - f_c$$

where m is the integer rounded-off value of the expression $(4f_c - f_s)/2f_s$. The frequency offset factor $\Delta f$ will be used by the fine tuning circuit 30, as described below.

The A/D converter output, i.e., the digital sampled signal $\{r(kT_s), \text{with } T_s=1/f_s \text{ and } k=0, 1, \ldots\}$, is serially inputted into the switching circuit 24 which alternately switches between the received digital signal samples to produce a sequence of even samples $\{r(kT_s), \text{with } T_s=1/f_s \text{ and } k=0, 2, 4, \ldots\}$ and a sequence of odd samples $\{r(kT_s), \text{with } T_s=1/f_s \text{ and } k=1, 3, 5, \ldots\}$.

The sign correction circuit 26 receives the non-negative integer value m from the selecting circuit 22 and the sequences of even samples and odd samples from the switching circuit 24, and generates the sequences I and Q according to the following formula:

$$I = \{r(0), -r(2T_s), r(4T_s), -r(6T_s), \ldots\},$$

if m is even, $Q = \{-r(T_s), r(3T_s), -r(5T_s), r(7T_s), \ldots\},$ if m is odd, $Q = \{r(T_s), -r(3T_s), r(5T_s), -r(7T_s), \ldots\}.$ The sequences I and Q, as constructed, are equal to a sampled in-phase component and a sampled quadrature component, respectively, of a complex signal centered near the baseband frequency having a frequency spectrum equal to the analog bandpass signal frequency spectrum.

The complex signal corresponding to the sequences I and Q is centered at $\Delta f$. Thus, by generating the sequences I and Q, the sign correction circuit 26 shifts the image of the analog bandpass signal frequency spectrum, that was centered at $f_s/4+\Delta f$, by an amount equal to $f_s/4$ toward the baseband frequency. If, in addition, the sampling frequency $f_s$ is also equal to $4f_c/(2m+1)$, i.e., if $f_s$ also satisfies the quadrature sampling condition, then the complex signal corresponding to the sequences I and Q, is centered at $\Delta f=0$ kHz.

The following discussion will show that the sequences I and Q correspond to the in phase and quadrature components, respectively, of the complex baseband signal if the sampling frequency $f_s$ is equal to $4f_c/(2m+1)$, for m a positive integer.

It is well known that a real bandpass signal r(t) having a carrier frequency $f_c$ can be written as:

$$r(t) = \text{Re}\{u(t)e^{j2\pi f_c t}\}$$

where Re{} denotes the real part of the inner expression and $$u(t) = I(t) + jQ(t)$$

is the complex, equivalent baseband signal for r(t), with I(t) and Q(t) denoting the in-phase and quadrature components, respectively. If the sampling frequency $f_s=1/T_s$ is equal to $4f_c/(2m+1)$, for m a positive integer, then the digital sampled signal obtained by sampling r(t) is:

$$r[k] = r(kT_s) = \text{Re}\{[I(kT_s) + jQ(kT_s)]e^{j2\pi k f_c(2m+1)/(4f_c)}\}$$

or, equivalently, $$r[k] = \text{Re}\{[I(kT_s) + jQ(kT_s)][(-1)^m j]^k\},$$

When m is odd, $$r[k] = \{I(0), Q(T_s), -I(2T_s), -Q(3T_s), \ldots\},$$

and when m is even,

Thus, the sequences I and Q as formed by the sign $r[k]=\{I(0), -Q(T_s), -I(2T_s), Q(3T_s), \dots\}.$ correction circuit 26 are equal to a sampled in-phase component and a sampled quadrature component, respectively, of a complex signal centered at the baseband frequency of zero kilohertz having a frequency spectrum equal to the analog bandpass signal frequency spectrum, if the sampling frequency $f_s$ is equal to $4f_c/(2m+1)$, for m a positive integer.

It can be shown mathematically that, if the sampling frequency $f_s$ is not equal to $4f_c/(2m+1)$, then the sequences I and Q, as formed by the sign correction circuit 26, are equal to a sampled in-phase component and a sampled quadrature component, respectively, of the complex signal centered near the baseband frequency of 0 kHz. This complex signal is the equivalent signal for the analog bandpass signal.

As constructed, each of the sequences I and Q has a sample rate equal to $f_s/2$. To increase the sample rates of I and Q sequences to $f_s$ for subsequent demodulation functions, the sequences I and Q are inputted into the interpolation filter circuit 28, which forms the digital signals $I_1$ and $Q_1$ by interpolating one digital value between every two consecutive samples of the sequences I and Q, respectively. The resulting digital signals $I_1$ and $Q_1$ are lowpass filtered versions of the sequences I and Q, respectively, and have a sampling rate equal to $f_s$. If more than one digital value is interpolated between every two consecutive samples of each of the sequences I and Q, then each of the digital signals $I_1$ and $Q_1$ will have a sample rate greater than $f_s$.

The fine tuning circuit 30 shifts the digital signals $I_1$ and $Q_1$ by the amount $\Delta f$, as computed by the selecting circuit 22, in complex frequency to the baseband frequency. This shift is performed by forming the digital signals $I_2$ and $Q_2$ according the following formula:

$I_2(kT_s)=I_1(kT_s)\cos(2\pi\Delta f kT_s)-Q_1(kT_s)\sin(2\pi\Delta f kT_s),$ $Q_2(kT_s)=Q_1(kT_s)\cos(2\pi\Delta f kT_s)+I_1(kT_s)\sin(2\pi\Delta f kT_s),$ for k=0, 1, 2, ...,
where $T_s=1/f_s$. The digital signals $I_2$ and $Q_2$ are approximately equal to an in-phase component and a quadrature component, respectively, of a digital baseband frequency signal which has a frequency spectrum, centered at the baseband frequency, approximately equal to the analog bandpass signal frequency spectrum centered at frequency $f_c$. The sample rate of each of the digital signals $I_2$ and $Q_2$ is equal to that of each of the digital signals $I_1$ and $Q_1$, which is equal to $f_s$ in the preferred embodiment of the present invention.

For a multi-channel digital receiver, the digital signals $I_2$ and $Q_2$ can be passed through optional lowpass filter circuit 40 to further suppress unwanted signals outside the channel of interest. The two outputs 41, 42 of the optional lowpass filter circuit 40, corresponding to lowpass filtered versions of the digital signals $I_2$ and $Q_2$, respectively, can be used as inputs to a standard demodulator.

FIG. 2 shows the disclosed system, with the exception of the A/D converter 10, implemented as an integral part of a digital signal processor.

Referring to FIG. 2, an analog bandpass signal $\{r(t)\}$ having a carrier frequency $f_c$ and a two-sided bandwidth not greater than B is sampled by the A/D converter 10 at the sampling frequency $f_s$ to generate the digital sampled signal $\{r(kT_s),$ with $T_s=1/f_s$ and $k=0, 1, \dots\}$ which is subsequently processed by the coarse tuning circuit 20, the fine tuning circuit 30 and the optional lowpass filter circuit 40 as discussed above.

The outputs 41, 42 of the optional lowpass filter circuit 40 are then processed by the demodulator 50 and the detector/decoder 60 to determine the original information bit sequence sent by a transmitter. To ensure correct decoding of the information bit sequence, the outputs 51, 61 of the demodulator 50 and detector/decoder 60, respectively, are processed by the synchronization/tracking circuit 70 which communicates with the controller 80. The controller 80 typically includes a timing recovery circuit which allows it to communicate to the A/D converter 10 the correct time to start sampling.

The controller 80 is also connected to the coarse tuning circuit 20 to communicate the actual value of $f_c$ which may deviate from its nominal value.

It is understood that the exemplary direct frequency selection and down-conversion system described herein and shown in the drawings represent only a presently preferred embodiment of the invention. Indeed, various modifications and additions may be made to such embodiment without departing from the spirit and scope of the invention. Those skilled in the art will recognize that various other configurations are equivalent and therefore likewise suitable. For example, various types of lowpass filters may be used to implement the interpolation filter circuit 28. Thus, modifications and additions may be obvious to those skilled in the art and may be implemented to adapt the present invention for use in a variety of different applications, such as direct frequency selection and down-conversion for DSP-based digital radios, direct down-conversion of bandpass signals having arbitrary frequencies, digital frequency tuning, and bandpass signal representation and signal reconstruction.

What is claimed is:

1. A method for performing direct frequency selection and down-conversion on an analog bandpass signal for a digital receiver having C channels, each of the C channels having a bandwidth B, frequency spectrum of the analog bandpass signal having a center frequency $f_c$ and a two-sided bandwidth not greater than B in one of the C channels, the method comprising:

(a) sampling the analog bandpass signal at a sampling frequency $f_s$, $f_s$ being greater than twice the product of B and C, to produce a digital sampled signal, the digital sampled signal having an intermediate frequency proximate of a baseband frequency, the intermediate frequency being closer to the baseband frequency than the sampling frequency $f_s$;

(b) computing, from $f_c$ and $f_s$, a non-negative integer value m, said value m determining selection of a channel from the C channels of the digital receiver;

(c) forming from said digital sampled signal $\{r(kT_s),$ with $T_s=1/f_s$ and $k=0, 1, \dots\}$ a sequence of even samples $\{r(kT_s),$ with $T_s=1/f_s$ and $k=0, 2, 4, \dots\}$ and a sequence of odd samples $\{r(kT_s),$ with $T_s=1/f_s$ and $k=1, 3, 5, \dots\}$;

(d) generating from the sequences of even samples and odd samples a sequence I and a sequence Q such that the sequences I and Q are approximately equal to an in-phase component and a quadrature component, respectively, of a complex signal centered near the baseband frequency having a frequency spectrum approximately equal to the analog bandpass signal frequency spectrum; and (e) forming first digital signals $I_1$ and $Q_1$ by interpolating at least one digital value between every two consecutive samples of the sequences I and Q, respectively resulting in each of the first digital signals $I_1$ and $Q_1$ being lowpass filtered and having a sampling rate greater than that of each of the sequences I and Q.

2. The method for performing direct frequency selection and down-conversion as recited in claim 1 wherein the sequences I and Q are generated according to the following formula:

$$I=\{r(0), -r(2T_s), r(4T_s), -r(6T_s), \ldots\},$$

$$\text{if m is even, } Q=\{-r(T_s), r(3T_s), -r(5T_s), r(7T_s), \ldots\},$$

$$\text{if m is odd, } Q=\{r(T_s), -r(3T_s), r(5T_s), -r(7T_s), \ldots\},$$

where m is the integer rounded-off value of the expression $(4f_c-f_s)/2f_s$.

3. The method for performing direct frequency selection and down-conversion as recited in claim 1 further comprising the steps of:
  (1) shifting in complex frequency the first digital signals $I_1$ and $Q_1$ by an amount equal to $\Delta f$ to form second digital signals $I_2$ and $Q_2$; and
  (2) outputting the second digital signals $I_2$ and $Q_2$ which correspond to an in-phase component and a quadrature component, respectively, of a complex baseband frequency signal, the complex baseband frequency signal having a frequency spectrum, centered at the baseband frequency, approximately equal to the analog bandpass signal frequency spectrum centered at the frequency $f_c$.

4. The method as recited in claim 1 wherein the sampling frequency $f_s$ is equal to $4f_c/(2m+1)$.

5. The method as recited in claim 1 wherein the sampling frequency $f_s$ is not equal to $4f_c/(2m+1)$.

6. The method as recited in claim 1 wherein the sampling frequency $f_s$ is such that the intermediate frequency of the digital sampled signal differs from the baseband frequency by an amount equal to $(f_s/4)+\Delta f$.

7. The method as recited in claim 1 wherein the frequency $\Delta f$ is equal to $(2m+1)(f_s/4)-f_c$, where m is the integer rounded-off value of the expression $(4f_c-f_s)/2f_s$.

8. The method as recited in claim 3 wherein the second digital signals $I_2$ and $Q_2$ are formed from the first digital signals $I_1$ and $Q_1$ according to the following formula:

$$I_2(kT_s)=I_1(kT_s)\cos(2\pi\Delta fkT_s)-Q_1(kT_s)\sin(2\pi\Delta fkT_s),$$

$$Q_2(kT_s)=Q_1(kT_s)\cos(2\pi\Delta fkT_s)+I_1(kT_s)\sin(2\pi\Delta fkT_s),$$

$$\text{for } k=0, 1, 2, \ldots,$$

where $T_s=1/f_s$.

9. The method as recited in claim 1 wherein the baseband frequency is equal to zero kilohertz.

10. A coarse tuning circuit for a digital receiver having C channels, each of the C channels having a bandwidth B, the coarse tuning circuit down-converting to a frequency near a baseband frequency a digital sampled signal formed by sampling an analog bandpass signal at a sampling frequency $f_s$, frequency spectrum of the analog bandpass signal having a center frequency $f_c$ and a two-sided bandwidth not greater than B in one of the C channels, the sampling frequency $f_s$ being greater than twice the product of B and C, the coarse tuning circuit comprising:
  (a) a selecting circuit for computing, from $f_c$ and $f_s$, a non-negative integer value m, said value m determining selection of a channel from the C channels of the digital receiver;
  (b) a switching circuit having an input port to receive said digital sampled signal $\{r(kT_s)$, with $T_s=1/f_s$ and $k=0, 1, \ldots\}$, and an output port to produce a sequence of even samples and a sequence of odd samples, said sequences being formed from the received digital sampled signal;
  (c) a sign correction circuit, in electrical communication with the selecting circuit and with the switching circuit to receive the non-negative integer value m and the sequences of even samples and odd samples, for generating a sequence I and a sequence Q such that the sequences I and Q are approximately equal to an in-phase component and a quadrature component, respectively, of a complex signal centered near the baseband frequency having a frequency spectrum approximately equal to the analog bandpass signal frequency spectrum; and
  (d) an interpolation filter circuit, in electrical communication with the sign correction circuit to receive the sequences I and Q, for forming output digital signals $I_1$ and $Q_1$ by interpolating at least one digital value between every two consecutive samples of the sequences I and Q, respectively, resulting in each of the output digital signals $I_1$ and $Q_1$ being lowpass filtered and having a sampling rate greater than that of each of the sequences I and Q.

11. The coarse tuning circuit as recited in claim 10 wherein the non-negative integer value m computed by the selecting circuit is equal to the integer rounded-off value of the expression $(4f_c-f_s)/2f_s$.

12. The coarse tuning circuit as recited in claim 10 wherein the sign correction circuit generates the sequences I and Q according to the following formula:

$$I=\{r(0), -r(2T_s), r(4T_s), -r(6T_s), \ldots\},$$

$$\text{if m is even, } Q=\{-r(T_s), r(3T_s), -r(5T_s), r(7T_s), \ldots\},$$

$$\text{if m is odd, } Q=\{r(T_s), -r(3T_s), r(5T_s), -r(7T_s), \ldots\}.$$

13. The coarse tuning circuit as recited in claim 12 wherein the sign correction circuit translates an image signal centered at a frequency proximate of $f_s/4$ toward the baseband frequency by an amount equal to $f_s/4$, said image signal being included in the digital sampled signal and having a frequency spectrum approximately equal to the analog bandpass signal frequency spectrum.

14. The coarse tuning circuit as recited in claim 12 wherein the sampling frequency $f_s$ is equal to $4f_c/(2m+1)$.

15. The coarse tuning circuit as recited in claim 12 wherein the sampling frequency $f_s$ is not related to the frequency $f_c$.

16. The coarse tuning circuit as recited in claim 10 wherein the baseband frequency is equal to zero kilohertz.

17. A system for digitally performing direct frequency selection and down-conversion on an analog bandpass signal for a digital receiver having C channels, each of the C channels having a bandwidth B, frequency spectrum of the analog bandpass signal having a center frequency $f_c$ and a two-sided bandwidth not greater than B in one of the C channels, the system comprising:
  (a) an analog-to-digital (A/D) converter for sampling the analog bandpass signal at a sampling frequency $f_s$ greater than twice the product of B and C, and for outputting a digital sampled signal, the digital sampled signal having an intermediate frequency closer to a baseband frequency than $f_s$;
  (b) a coarse tuning circuit, in electrical communication with the A/D converter, for shifting the intermediate frequency of the digital sampled signal toward the baseband frequency by generating two first digital signals $I_1$ and $Q_1$, the shifted intermediate frequency differing from the baseband frequency by an amount $\Delta f$; and (c) a fine tuning circuit, in electrical communication with the coarse tuning circuit, for shifting in complex frequency toward the baseband frequency the first digital signals $I_1$ and $Q_1$ by the amount $\Delta f$ to form second digital signals $I_2$ and $Q_2$ the second digital signals $I_2$ and $Q_2$ being approximately equal to an in-phase component and a quadrature component, respectively, of a digital baseband frequency signal, the digital baseband frequency signal having a frequency spectrum, centered at the baseband frequency, approximately equal to the analog bandpass signal frequency spectrum centered at frequency $f_c$ (d) wherein the coarse tuning circuit comprises:
  (i) a selecting circuit for computing, from $f_c$ and $f_s$, a non-negative integer value m, said value m determining selection of a channel from the C channels of the digital receiver;
  (ii) a switching circuit having an input port to receive said digital sampled signal $\{r(kT_s)$, with $T_s=1f_s$ and $k=0, 1, \ldots \}$, and an output port to produce a sequence of even samples and a sequence of odd samples, said sequences being formed from the received digital sampled signal;
  (iii) a sign correction circuit, in electrical communication with the selecting circuit and with the switching circuit to receive the non-negative integer value m and the sequences of even samples and odd samples, for generating a sequence I and a sequence Q such that the sequences I and Q are approximately equal to an in-phase component and a quadrature component, respectively, of a complex signal centered near the baseband frequency having a frequency spectrum approximately equal to the analog bandpass signal frequency spectrum; and
  (iv) an interpolation filter circuit, in electrical communication with the sign correction circuit to receive the sequences I and Q, for forming first digital signals $I_1$ and $Q_1$ by interpolating at least one digital value between every two consecutive samples of the sequences I and Q, respectively, resulting in each of the first digital signals $I_1$ and $Q_1$ being lowpass filtered and having a sampling rate greater than that of each of the sequences I and Q.

18. The system as recited in claim 17 wherein the sampling frequency $f_s$ is equal to $4f_c/(2m+1)$.

19. The system as recited in claim 17 wherein the sampling frequency $f_s$ is not equal to $4f_c(2m+1)$.

20. The system as recited in claim 17 wherein the sampling frequency $f_s$ is such that the intermediate frequency of the digital sampled signal differs from the baseband frequency by an amount equal to $(f_s/4)+\Delta f$.

21. The system as recited in claim 17 wherein the non-negative integer value m computed by the selecting circuit is equal to the integer rounded-off value of the expression $(4f_c-f_s)/2f_s$.

22. The system as recited in claim 21 wherein the sign correction circuit generates the sequences I and Q according to the following formula:

$$I=\{r(0), -r(2T_s), r(4T_s), -r(6T_s), \ldots \},$$

$$\text{if m is even, } Q=\{-r(T_s), r(3T_s), -r(5T_s), r(7T_s), \ldots \},$$

$$\text{if m is odd, } Q=\{r(T_s), -r(3T_s), r(5T_s), -r(7T_s), \ldots \}.$$

23. The system as recited in claim 18 wherein the sign correction circuit translates an image signal centered at a frequency proximate of $f_s/4$ toward the baseband frequency by an amount equal to $f_s/4$, said image signal being included in the digital sampled signal and having a frequency spectrum approximately equal to the analog bandpass signal frequency spectrum.

24. The system as recited in claim 17 wherein the coarse tuning circuit computes the value of $\Delta f$ according to the following formula:

$$\Delta f=(2m+1)(f_s/4)-f_c$$

where m is the integer rounded-off value of the expression $(4f_c-f_s)/2f_s$.

25. The system as recited in claim 17 wherein the fine tuning circuit forms the second digital signals $I_2$ and $Q_2$ from the first digital signals $I_1$ and $Q_1$ according to the following formula:

$$I_2(kT_s)=I_1(kT_s)\cos(2\pi\Delta f kT_s)-Q_1(kT_s)\sin(2\pi\Delta f kT_s),$$

$$Q_2(kT_s)=Q_1(kT_s)\cos(2\pi\Delta f kT_s)+I_1(kT_s)\sin(2\pi\Delta f kT_s),$$

$$\text{for } k=0, 1, 2, \ldots, \text{ where } T_s=1/f_s.$$

26. The system as recited in claim 17 further comprising a lowpass filter circuit for receiving and filtering the second digital signals $I_2$ and $Q_2$.

27. The system as recited in claim 17 wherein the baseband frequency is equal to zero kilohertz.

* * * * *

UNITED STATES PATENT AND TRADEMARK OFFICE
CERTIFICATE OF CORRECTION

PATENT NO.  : 5,982,823  
DATED       : November 9, 1999  
INVENTOR(S) : Jacklin Page 1 of 1

It is certified that error appears in the above-identified patent and that said Letters Patent is hereby corrected as shown below:

<u>Title page,</u>
Insert Item [30], to read as follows:
-- Assignee: Northrop Grumman Corporation, Los Angeles, CA (US) --

Signed and Sealed this

Sixteenth Day of July, 2002

*Attest:*

JAMES E. ROGAN
*Attesting Officer*    *Director of the United States Patent and Trademark Office*